United States Patent
Chen

(10) Patent No.: US 9,269,709 B2
(45) Date of Patent: Feb. 23, 2016

(54) MOS TRANSISTOR STRUCTURE AND METHOD

(71) Applicant: Taiwan Semiconductor Manufacturing Company, Ltd., Hsin-Chu (TW)

(72) Inventor: Po-Yu Chen, Baoshan Township (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 115 days.

(21) Appl. No.: 13/776,370

(22) Filed: Feb. 25, 2013

(65) Prior Publication Data

US 2014/0239387 A1 Aug. 28, 2014

(51) Int. Cl.
| | |
|---|---|
| *H01L 29/76* | (2006.01) |
| *H01L 29/94* | (2006.01) |
| *H01L 27/088* | (2006.01) |
| *H01L 21/8234* | (2006.01) |

(52) U.S. Cl.
CPC ...... *H01L 27/088* (2013.01); *H01L 21/823487* (2013.01)

(58) Field of Classification Search
CPC .............................. H01L 27/088; H01L 21/82
USPC .......................................... 257/334; 438/270
See application file for complete search history.

(56) References Cited

U.S. PATENT DOCUMENTS

| | | | |
|---|---|---|---|
| 5,460,989 A * | 10/1995 | Wake | 438/259 |
| 5,723,891 A * | 3/1998 | Malhi | 257/341 |
| 8,298,875 B1 | 10/2012 | Or-Bach et al. | |
| 8,379,458 B1 | 2/2013 | Or-Bach et al. | |
| 2004/0032762 A1* | 2/2004 | Blanchard | 365/159 |
| 2007/0207621 A1* | 9/2007 | Guenther | 438/733 |
| 2010/0276662 A1 | 11/2010 | Colinge | |
| 2012/0273955 A1 | 11/2012 | Or-Bach et al. | |

FOREIGN PATENT DOCUMENTS

| | | |
|---|---|---|
| TW | 201232780 A | 8/2012 |
| WO | 2011046844 A1 | 4/2011 |

\* cited by examiner

*Primary Examiner* — Theresa T Doan
(74) *Attorney, Agent, or Firm* — Slater & Matsil, L.L.P.

(57) ABSTRACT

A MOS transistor structure comprises a substrate including a bulk semiconductor region, a first gate formed in a first trench, a first drain/source region, a second drain/source region, wherein the first drain/source region and the second drain/source region are formed on opposing sides of the first gate. The MOS transistor structure further comprises a second gate formed in a second trench, a third drain/source region, wherein the third drain/source region and the second drain/source region are formed on opposing sides of the second gate and a channel region formed in the bulk semiconductor region, wherein the channel region, the first drain/source region, the second drain/source region and the third drain source region share a same polarity.

19 Claims, 20 Drawing Sheets

MOS TRANSISTOR STRUCTURE AND METHOD

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrink the process node towards the sub-20 nm node). As semiconductor devices are scaled down, new techniques are needed to maintain the electronic components' performance from one generation to the next.

As semiconductor technologies evolve, metal oxide semiconductor (MOS) transistors have been widely used in today's integrated circuits. MOS transistors are voltage controlled device. When a control voltage is applied to the gate a MOS transistor and the control voltage is greater than the threshold of the MOS transistor, a conductive channel is established between the drain and the source of the MOS transistor. As a result, a current flows between the drain and the source of the MOS transistor. On the other hand, when the control voltage is less than the threshold of the MOS transistor, the MOS transistor is turned off accordingly.

MOS transistors may include two major categories. One is n-channel MOS transistors; the other is p-channel MOS transistors. According to the structure difference, MOS transistors can be further divided into three sub-categories, planar MOS transistors, lateral double diffused MOS transistors and vertical double diffused MOS transistors.

As semiconductor technologies further advance, silicon-on-insulator (SOI) based junction-less MOS transistors have emerged as an alternative technique to simplify the manufacturing process of MOS transistors. In a junction-less MOS transistor, a channel region of the junction-less MOS transistor is of the same polarity and the same doping concentration as the drain/source regions of the junction-less MOS transistor.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, a junction-less metal oxide semiconductor (MOS) transistor including a bulk semiconductor region. The embodiments of the disclosure may also be applied, however, to a variety of MOS transistors. Hereinafter, various embodiments will be explained in detail with reference to the accompanying drawings.

Figure 1:
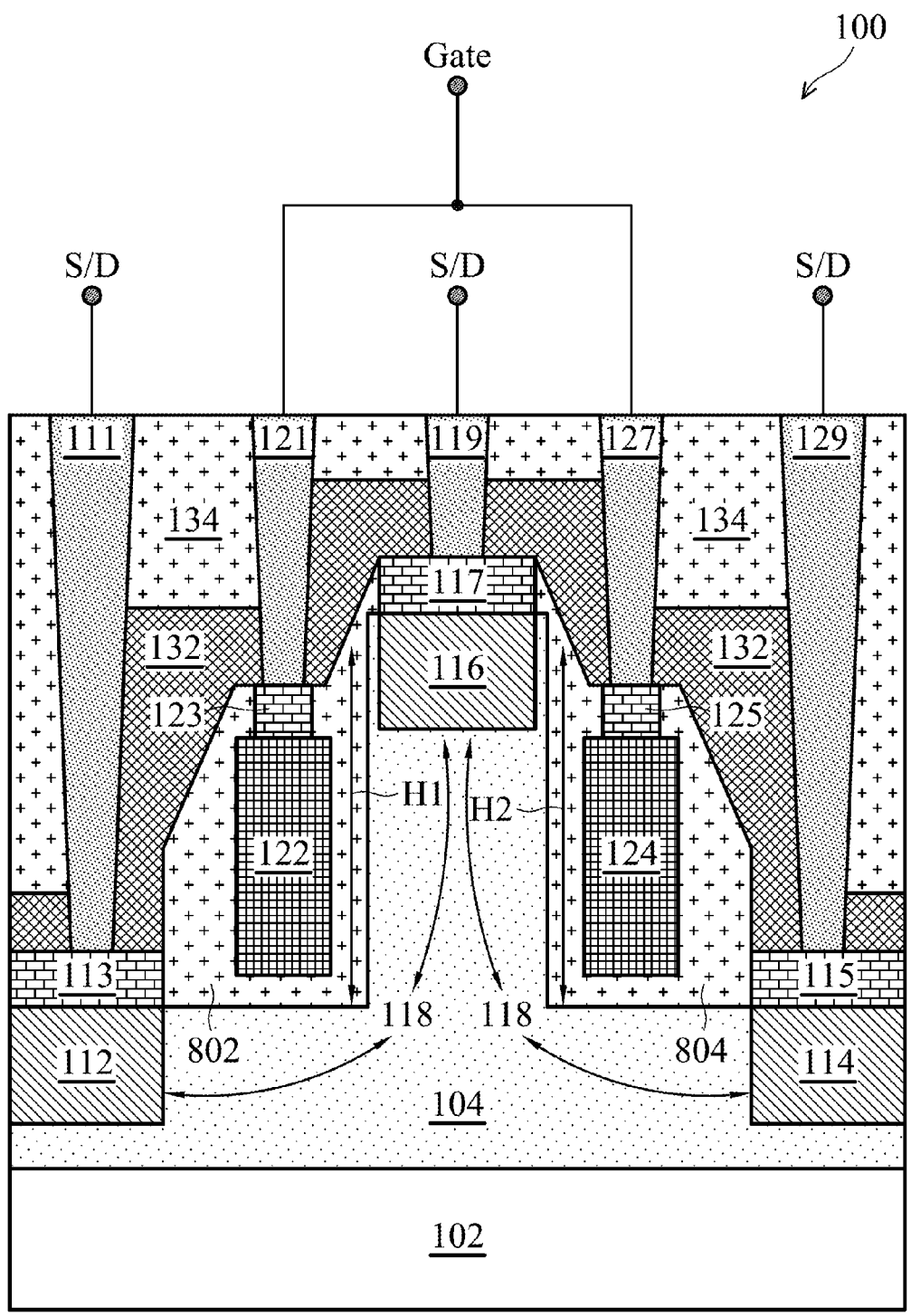
FIG. 1 illustrates a simplified cross-sectional view of a junction-less MOS transistor in accordance with various embodiments of the present disclosure.

FIG. 1 illustrates a simplified cross-sectional view of a junction-less MOS transistor in accordance with various embodiments of the present disclosure. The junction-less MOS transistor 100 comprises three drain/source regions 112, 114 and 116 formed in a bulk semiconductor region 104 as shown in FIG. 1. In some embodiments, the first drain/source region 112 and the second drain/source region 114 are coupled together and function as a drain of the junction-less MOS transistor 100. The third drain/source region 116 may function as a source of the junction-less MOS transistor 100. In alternative embodiments, the third drain/source region 116 may function as a drain and the drain/source regions 112 and 114 may function as a source.

As shown in FIG. 1, a channel region 118 may be formed between the drain and the source of the junction-less MOS transistor 100. More particularly, the channel region 118 is formed in the bulk semiconductor region 104. The channel region 118, the drain regions and the source regions of the junction-less MOS transistor 100 may be of the same polarity and the same doping concentration. In other words, the junctions between the drain and the channel and the junction between the source and the channel do not exist in the junction-less MOS transistor 100. As such, the MOS transistor structure shown in FIG. 1 is commonly known as a junction-less MOS transistor.

One advantageous feature of the junction-less MOS transistor shown in FIG. 1 is that the current handling capability of the junction-less MOS transistor 100 is improved because the transistor does not include an accumulation region, which is commonly included in a conventional MOS transistor.

The junction-less MOS transistor 100 includes the bulk semiconductor region 104 formed over a substrate 102. The bulk semiconductor region 104 may be a first conductivity. In some embodiments, the bulk semiconductor region 104 may be an n-type semiconductor region, which is formed by implanting n-type dopants such as phosphorous and the like at a concentration of between about $1 \times 10^{15}/cm^3$ and about $1 \times 10^{19}/cm^3$. Alternatively, the bulk semiconductor region 104 may be a p-type substrate, which is formed by implanting p-type dopants such as boron and the like at a concentration of between about $1 \times 10^{15}/cm^3$ and about $1 \times 10^{19}/cm^3$.

The first drain/source region 112, the second drain/source region 114 and the third drain/source region 116 are formed in the upper portion of the bulk semiconductor region 104. In accordance with some embodiments, the drain/source regions 112, 114 and 116 may function as either a drain or a source depending on different applications. Moreover, the drain/source regions 112, 114 and 116 may be formed of either n-type dopants or p-type dopants depending on the polarity of the junction-less MOS transistor 100. For example, the drain/source regions 112, 114 and 116 may be formed by implanting an n-type dopant such as phosphorous at a concentration of between about $1 \times 10^{18}/cm^3$ and about $1 \times 10^{21}/cm^3$.

The junction-less MOS transistor 100 may further comprise a first gate 122 and a second gate 124. As shown in FIG. 1, both the first gate 122 and the second gate 124 are enclosed by dielectric layers 802 and 804 respectively. In particular, the dielectric layers 802 and 804 separate the gates 122 and 124 from the drain/source regions 112, 114 and 116.

In accordance with an embodiment, the gates 122 and 124 may be coupled together and further connected to a control signal. When the control signal is greater than the threshold voltage of the junction-less MOS transistor 100, the junction-less MOS transistor 100 is turned on. On the other hand, when the control signal is less than the threshold voltage, the channel of the junction-less MOS transistor 100 is depleted of electrons. As a result, the junction-less MOS transistor 100 is turned off accordingly.

Figure 7:
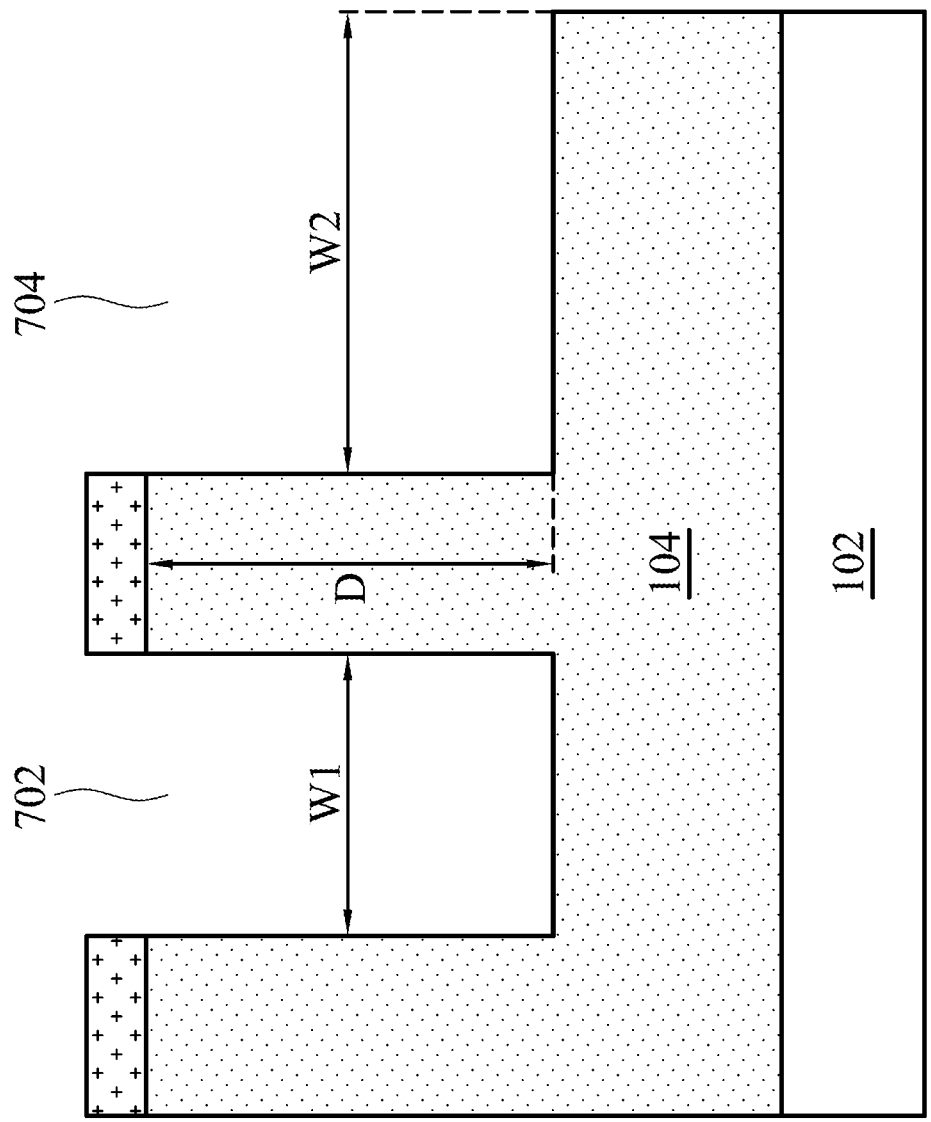

As shown in FIG. 1, the first gate 122 and the second gate 124 are formed in trenches (also shown in FIG. 7). The heights of the trenches are defined as H1 and H2 respectively. In accordance with some embodiments, H1 is in a range from about 10 nm to about 50 nm. H2 is in a range from about 10 nm to about 50 nm.

One skilled in the art will recognize that FIG. 1 illustrates an ideal profile. The dimensions of H1 and H2 may vary after subsequent fabrication processes. H1 and H2 shown in FIG. 1 are used to illustrate the inventive aspects of the various embodiments. The disclosure is not limited to any particular dimensions of H1 and H2.

The junction-less MOS transistor 100 may further comprise a plurality of silicide regions (e.g., silicide region 113), contact etching stop layers (e.g., CESL layer 132) and contact plugs (e.g., contact plug 111). The detailed formation of the structures above will be described below with respect to FIGS. 3-20.

One advantageous feature of a junction-less MOS transistor shown in FIG. 1 is that the bulk semiconductor region 104 helps to further simplify the manufacturing process of junction-less MOS transistors. In addition, the bulk substrate based junction-less MOS transistor may help to dissipate the power losses by connecting the junction-less MOS transistor to the bulk semiconductor region. As a result, the reliability of the junction-less MOS transistor may be improved.

Figure 2:
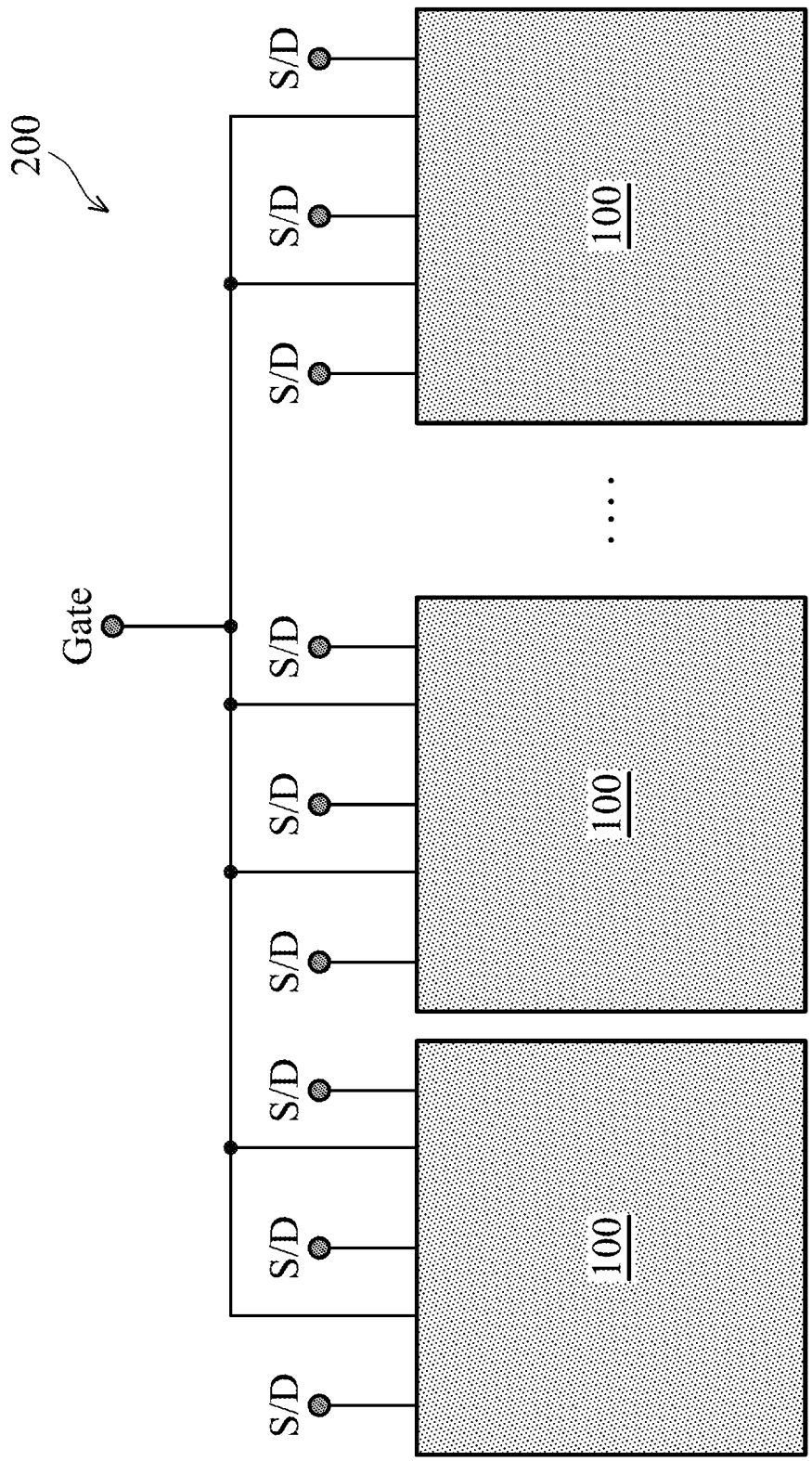
FIG. 2 illustrates a simplified cross-sectional view of a plurality of junction-less MOS transistors connected in parallel in accordance with various embodiments of the present disclosure.

FIG. 2 illustrates a simplified cross-sectional view of a plurality of junction-less MOS transistors connected in parallel in accordance with various embodiments of the present disclosure. In a power MOS transistor device, there may be a plurality of MOS transistor cells connected in parallel. As such, the power MOS transistor device may achieve lower on-resistance and higher load currents.

As shown in FIG. 2, each MOS transistor cell may be of the same structure. More particularly, each cell of the power MOS transistor device 200 is of the same structure as the junction-less MOS transistor 100 shown in FIG. 1. The drains of the plurality of MOS transistor cells are coupled together to form the drain of the power MOS transistor device 200. Likewise, the sources of the plurality of MOS transistor cells are coupled together to form the source of the power MOS transistor device 200. FIG. 2 further illustrates the gates of all cells (e.g., junction-less MOS transistor 100) are coupled together to form the gate of the power MOS transistor device 200. The detailed structure of each cell of the power MOS transistor device 200 has been described above with respect to FIG. 1, and hence is not discussed herein to avoid unnecessary repetition.

FIGS. 3-20 illustrate cross section views of various intermediate steps of fabricating a junction-less MOS transistor in accordance with various embodiments of the present disclosure.

Figure 3:
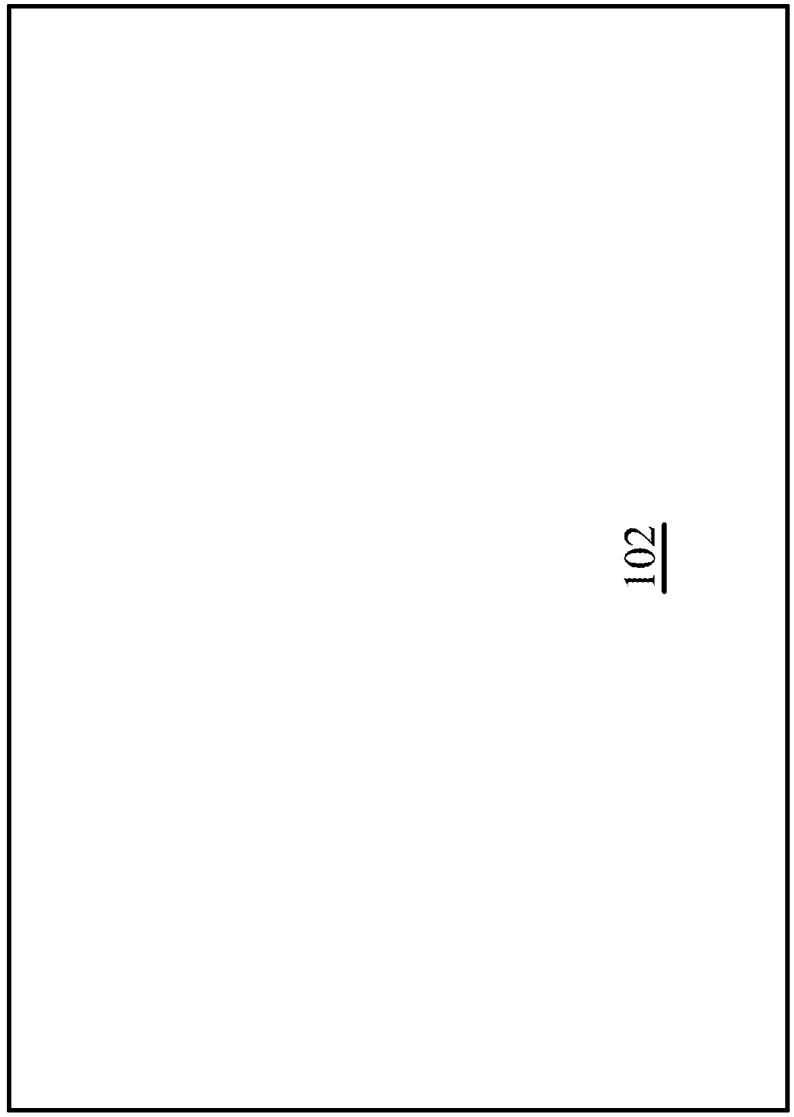
FIGS. 3-20 illustrate cross section views of intermediate steps of fabricating a junction-less MOS transistor in accordance with various embodiments of the present disclosure.

FIG. 3 illustrates a cross section view of a substrate in accordance with various embodiments of the present disclosure. The substrate 102 is formed of silicon, although it may also be formed of other group III, group IV, and/or group V elements, such as silicon, germanium, gallium, arsenic, and combinations thereof. The substrate 102 may be in the form of bulk substrate.

Figure 4:
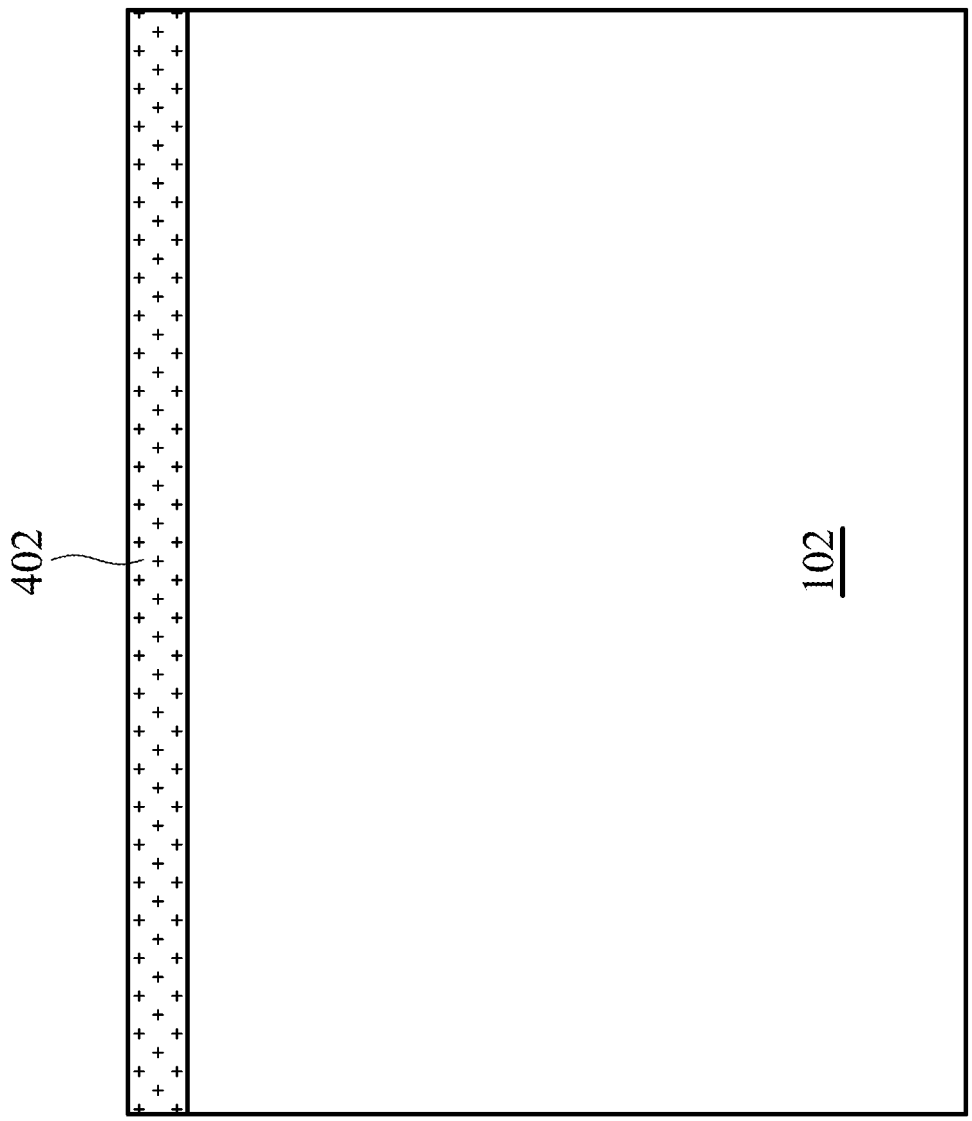

FIG. 4 illustrates a cross section view of the substrate after a dielectric layer is applied to a top surface of the substrate in accordance with various embodiments of the present disclosure. As shown in FIG. 4, a dielectric layer 402 is formed on top of the substrate 102. The dielectric layer 402 may be formed of various dielectric materials commonly used in integrated circuit fabrication. For example, the dielectric layer 402 may be formed of silicon dioxide, silicon nitride or a doped glass layer such as boron silicate glass and the like. Alternatively, dielectric layer may be a layer of silicon nitride, a silicon oxynitride layer, a polyamide layer, a low dielectric constant insulator or the like. In addition, a combination of the foregoing dielectric materials may also be used to form the dielectric layer 402. In accordance with some embodiments, the dielectric layer 402 may be formed using suitable techniques such as sputtering, oxidation, chemical vapor deposition (CVD) and/or the like.

Figure 5:
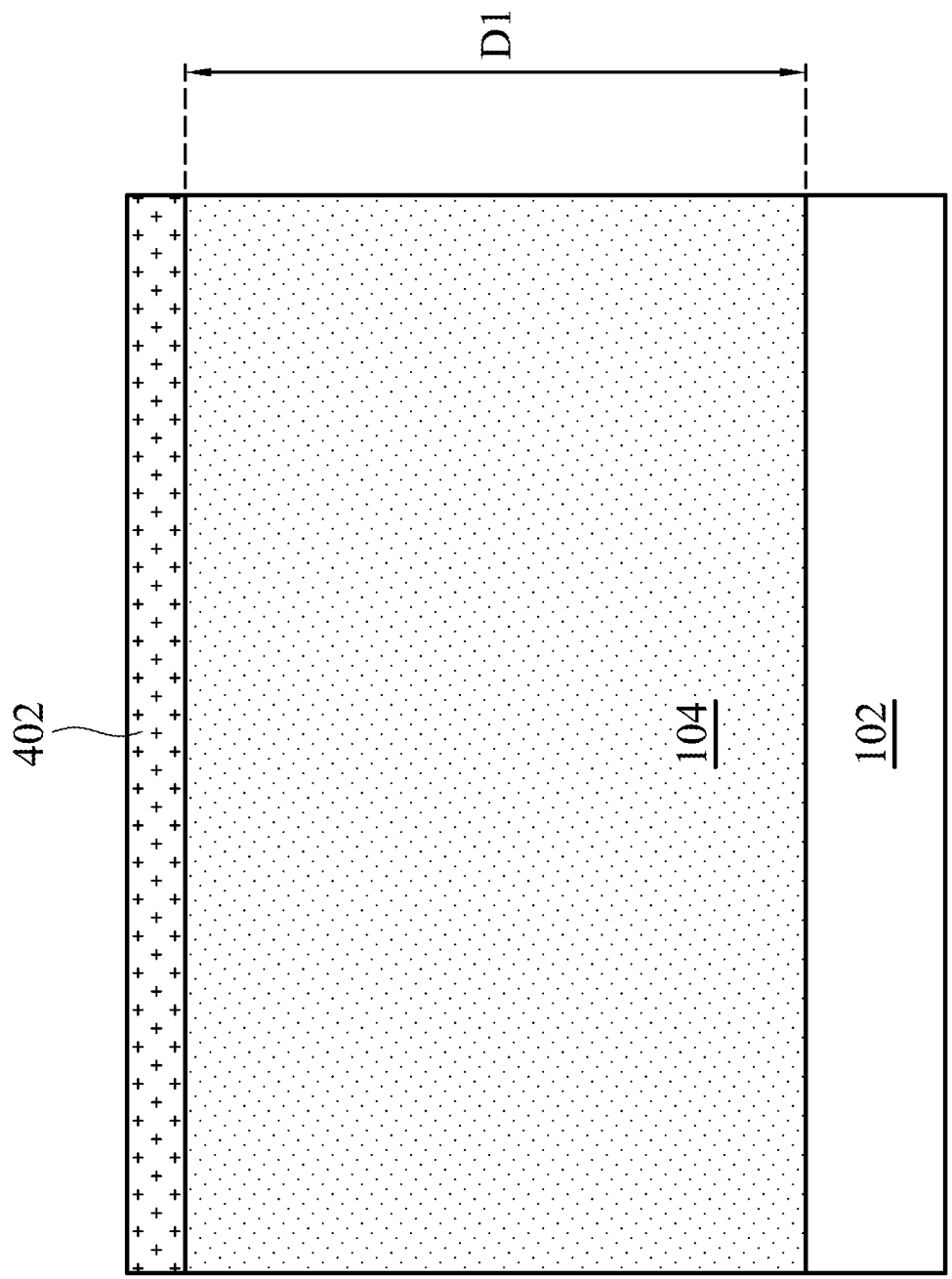

FIG. 5 illustrates a cross section view of the semiconductor device shown in FIG. 4 after an ion implantation process is applied to the substrate in accordance with various embodiments of the present disclosure. As is known to those of skill in the art, the use of dopant atoms in an implant step may form the semiconductor region 104 with a particular conductivity type. Depending on different applications, the semiconductor region 104 may be n-type or p-type. In some embodiments, the semiconductor region 104 is a p-type region. Appropriate p-type dopants such as boron, gallium, indium and/or the like are implanted into the substrate 102 to form the semiconductor region 104. Alternatively, the semiconductor region 104 is an n-type region. Appropriate n-type dopants such as phosphorous, arsenic and/or the like are implanted into the substrate 102 to form the semiconductor region 104.

In some embodiments, the doping concentration of the semiconductor region 104 is in a range from about $1\times10^{15}/cm^3$ to about $1\times10^{19}/cm^3$. By controlling the ion implantation energy, the depth of the semiconductor region 104 may be adjusted accordingly. In some embodiments, the depth as shown in FIG. 5 is defined as D1, which is in a range from about 0.1 um to about 2 um.

In comparison with a silicon-on-insulator (SOI) based junction-less MOS transistor, the semiconductor region 104 helps to form a vertical structure for the junction-less MOS transistor 100 shown in FIG. 1. Such a vertical structure helps to further improve heat dissipation through the bulk semiconductor region 104. In addition, such a vertical structure is compatible with the gate-last process flow, which is commonly used in the MOS transistor fabrication process.

Figure 6:
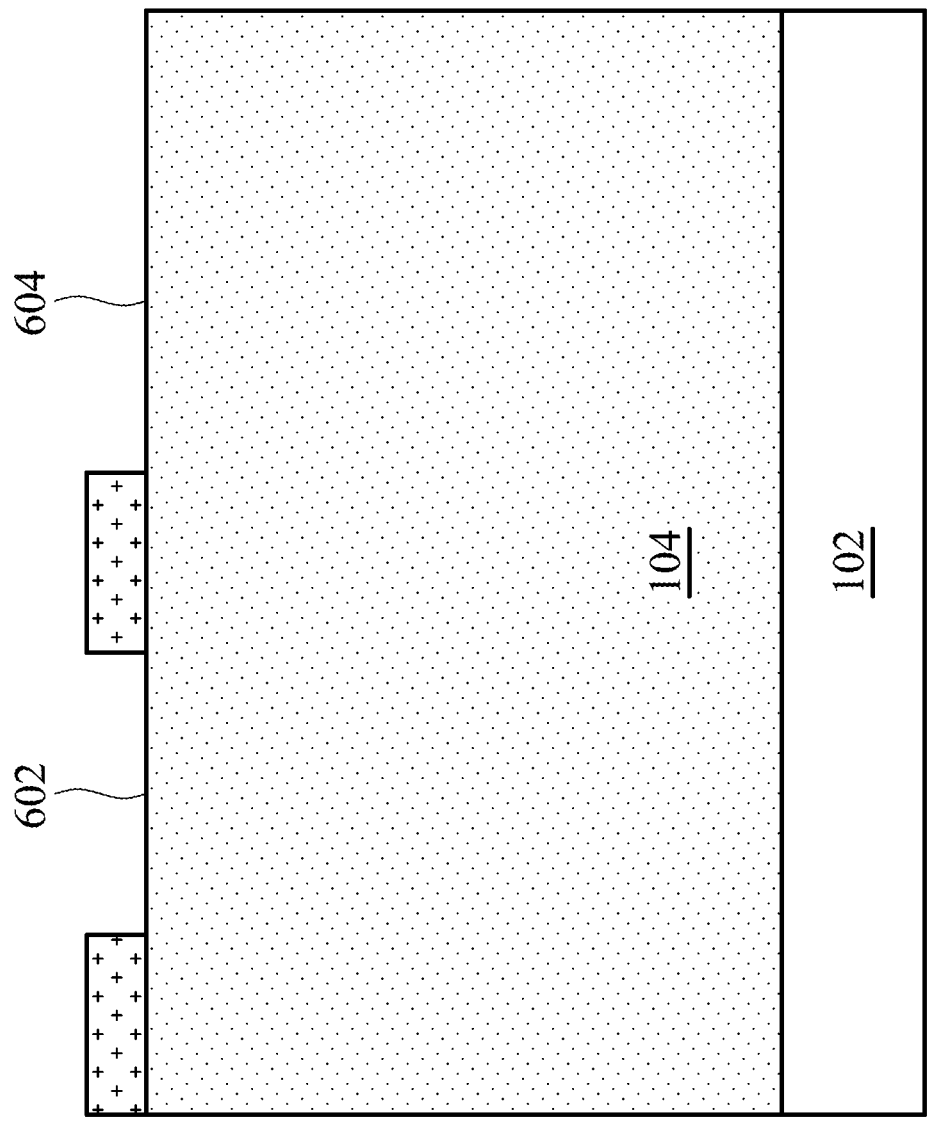

FIG. 6 illustrates a cross section view of the semiconductor device shown in FIG. 5 after an anisotropic etching process is applied to the semiconductor device in accordance with various embodiments of the present disclosure. A patterned mask (not shown), such as a photoresist mask, a hard mask and/or the like, is formed on the top surface of the semiconductor device using suitable deposition and photolithography techniques. Thereafter, a suitable etching process, such as a reactive ion etch (RIE) or other dry etch, an anisotropic wet etch, or any other suitable anisotropic etch or patterning process, may be performed to form openings 602 and 604. The remaining photo resist layer (not shown) may be removed by using a suitable ashing process.

FIG. 7 illustrates a cross section view of the semiconductor device shown in FIG. 6 after another etching process is applied to the semiconductor device in accordance with various embodiments of the present disclosure. In consideration with the location of the gates (e.g., gates 122 and 124) shown in FIG. 1, a suitable etching process such as an anisotropic etching process is performed to form trenches 702 and 704.

In some embodiments, the widths of the trenches 702 and 704 are defined as W1 and W2 respectively. The depth of the trenches 702 and 704 is defined as D. In some embodiments, W1 and W2 are in a range from about 10 nm to about 50 nm. D is in a range from about 10 nm to about 300 nm.

One skilled in the art will recognize that FIG. 7 illustrates an ideal profile. The dimensions of W1, W2 and D may vary after subsequent fabrication processes. W1, W2 and D shown in FIG. 7 are used to illustrate the inventive aspects of the various embodiments. The disclosure is not limited to any particular dimensions of W1, W2 and D.

Figure 8:
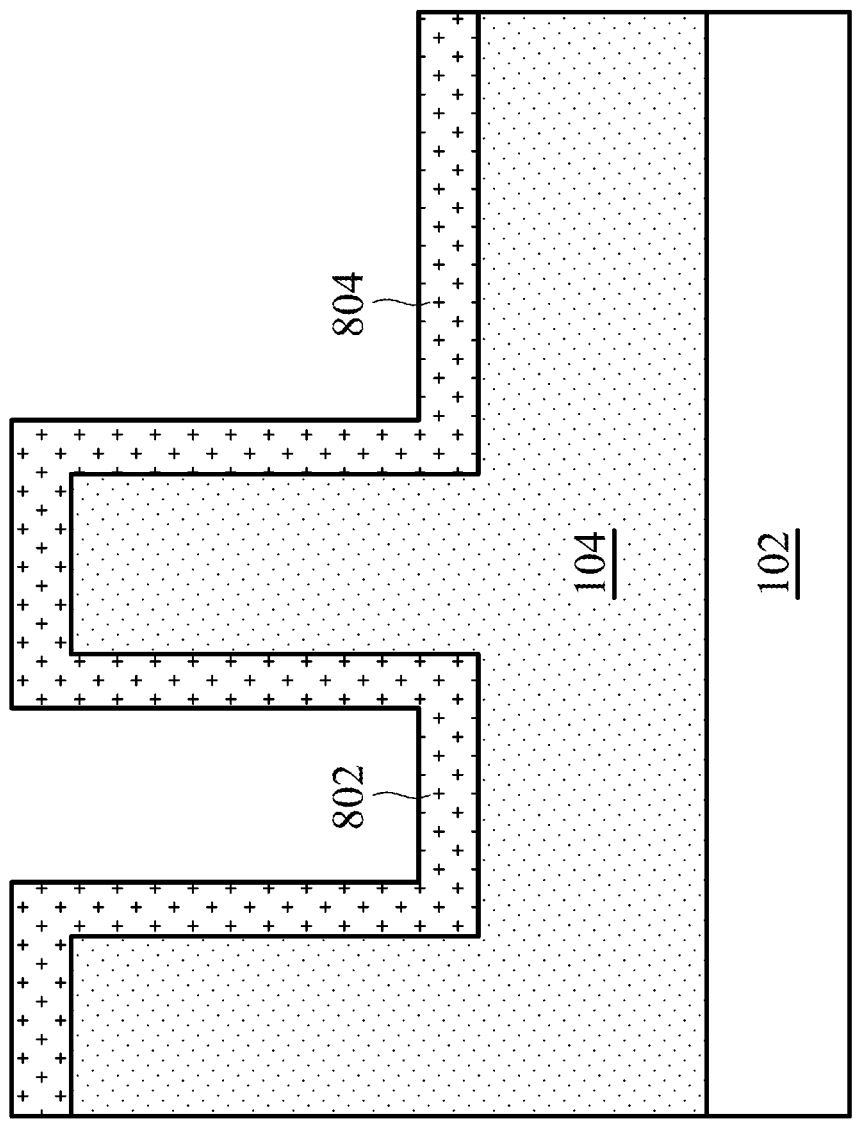

FIG. 8 illustrates a cross section view of the semiconductor device shown in FIG. 7 after a thin dielectric layer is formed in the trench 702 and the trench 704 in accordance with various embodiments of the present disclosure. The thin dielectric layers 802 and 804 may be may be an oxide layer thermally grown in the trench 702 and the trench 704 respectively. Alternatively, the thin dielectric layers 802 and 804 can be formed by other suitable techniques such as sputtering, oxidation and/or CVD.

Figure 9:
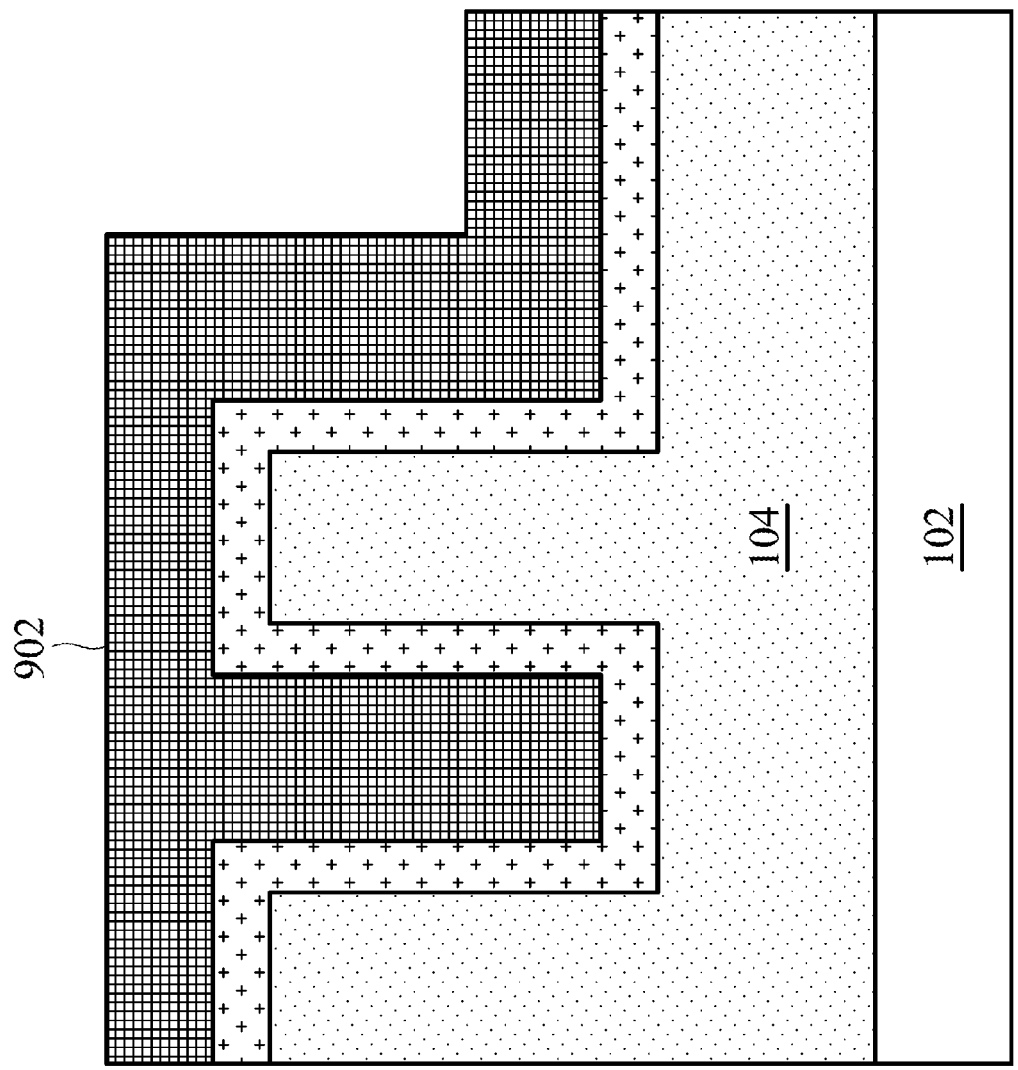

FIG. 9 illustrates a cross section view of the semiconductor device shown in FIG. 8 after a gate electrode material is filled in the trenches in accordance with various embodiments of the present disclosure. The gate electrode layer 902 may be formed of polysilicon. Alternatively, the gate electrode layer 902 may be formed of other commonly used conductive materials such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, combinations thereof, and/or the like.

Figure 10:
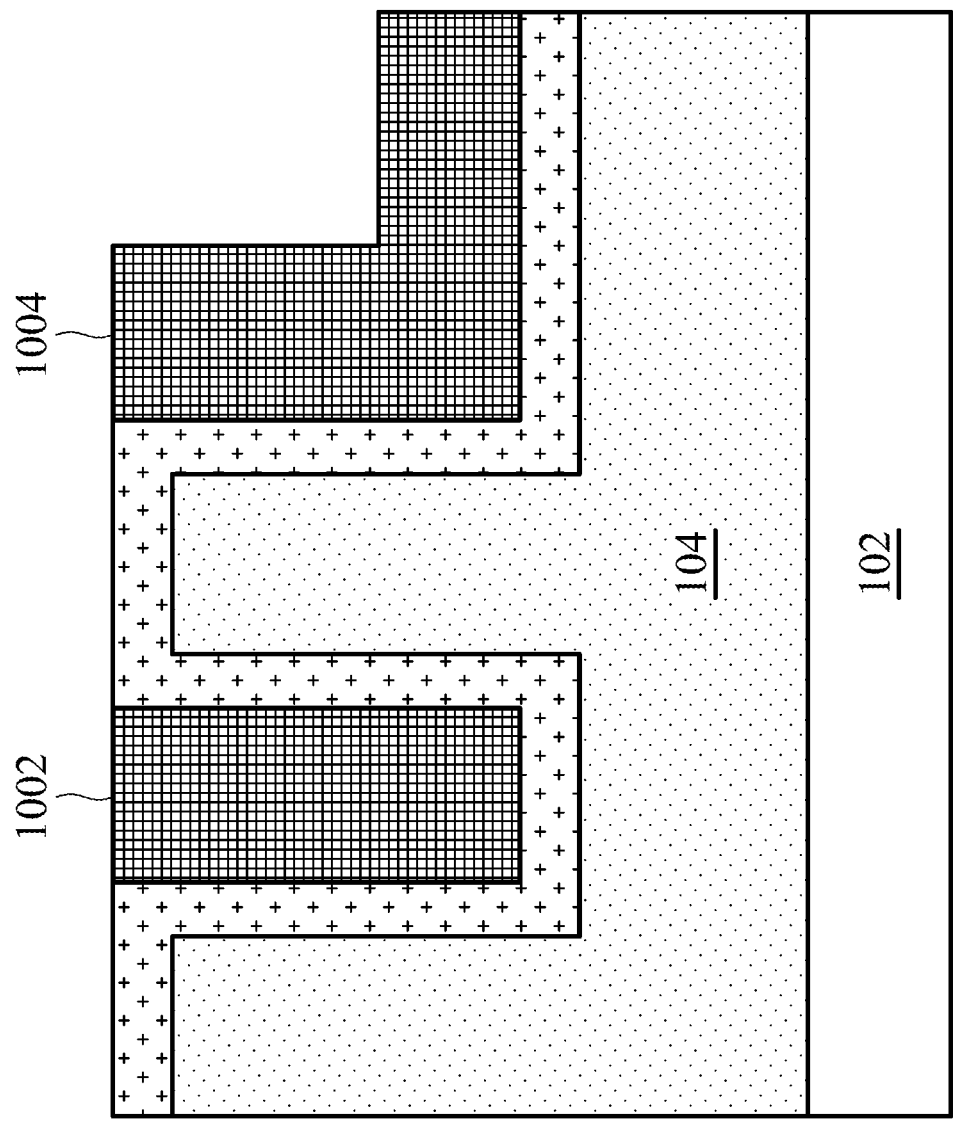

FIG. 10 illustrates a cross section view of the semiconductor device shown in FIG. 9 after a chemical mechanical polish (CMP) process is applied to the top surface of the semiconductor device in accordance with various embodiments of the present disclosure. A planarization process, such as CMP, etch back step and the like, may be performed to planarize the top surface of the gate electrode layer 902 (shown in FIG. 9). As shown in FIG. 10, a portion of the gate electrode layer 902 has been removed as a result. As shown in FIG. 10, there may be two gate electrode regions after the CMP process, namely a first gate electrode region 1002 and a second gate electrode region 1004.

Figure 11:
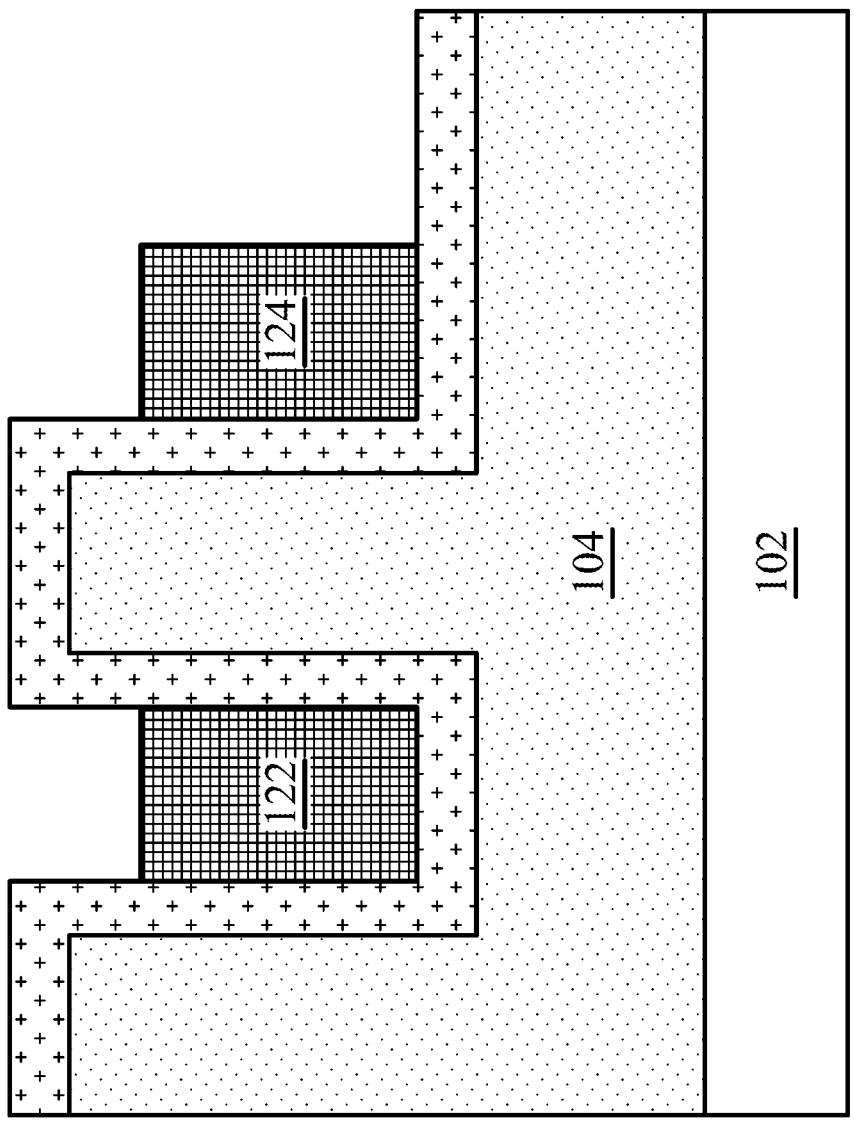

FIG. 11 illustrates a cross section view of the semiconductor device shown in FIG. 9 after an anisotropic etching process is applied to the gate electrode regions in accordance with various embodiments of the present disclosure. An anisotropic etching process is applied to the gate electrode regions 1002 and 1004. By controlling the strength and direction of the etching process, portions of the gate electrode regions 1002 and 1004 have been removed. The remaining gate electrode regions are the first gate 122 and the second gate 124 respectively as shown in FIG. 1.

Figure 12:
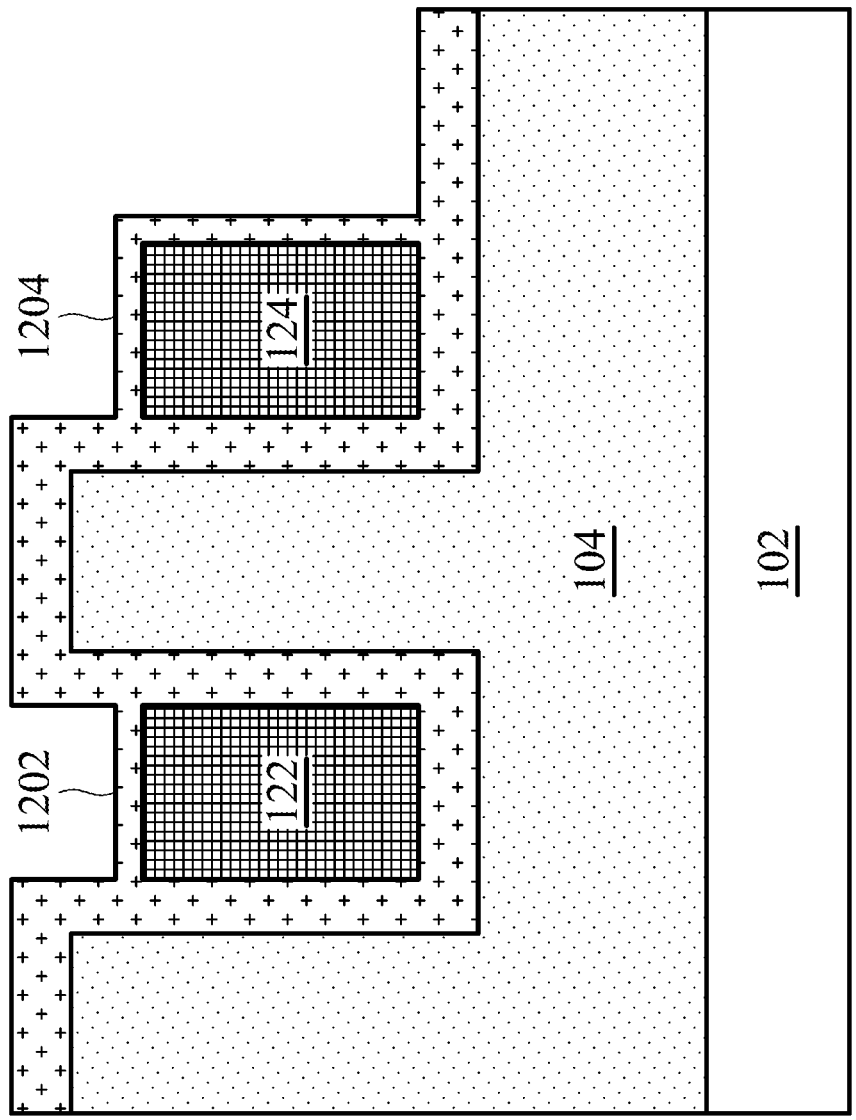

FIG. 12 illustrates a cross section view of the semiconductor device shown in FIG. 11 after thin liner oxide layers are formed on the gates in accordance with various embodiments of the present disclosure. The thin oxide layer 1202 may be thermally grown on top of the first gate 122. Likewise, the thin oxide layer 1204 may be thermally grown on top of the second gate 124 as well as the sidewall of the second gate 124.

Figure 13:
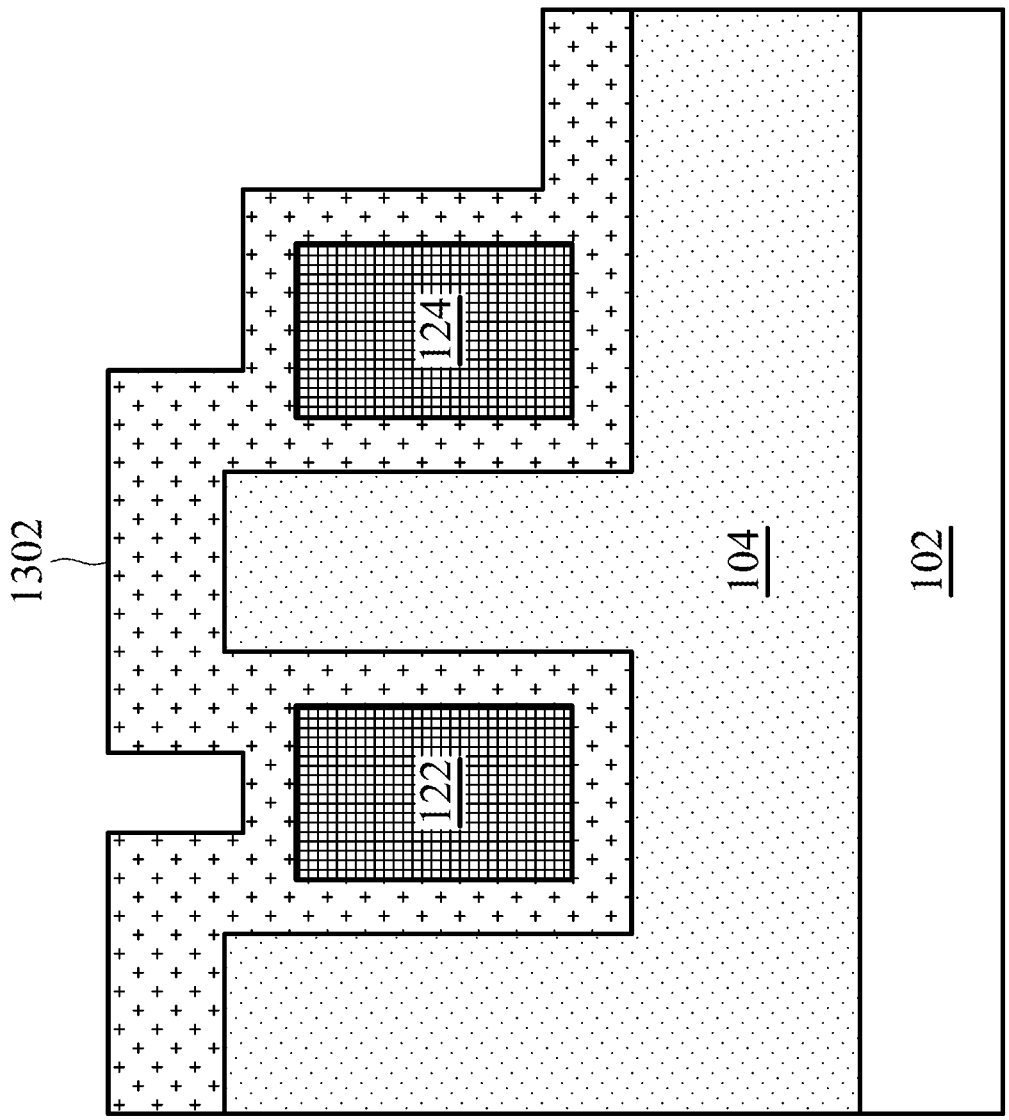

FIG. 13 illustrates a cross section view of the semiconductor device shown in FIG. 12 after a dielectric layer is formed over the top surface of the semiconductor device in accordance with various embodiments of the present disclosure. The dielectric layer 1302 may be formed using suitable techniques such as sputtering, oxidation and/or chemical vapor deposition (CVD).

Figure 14:
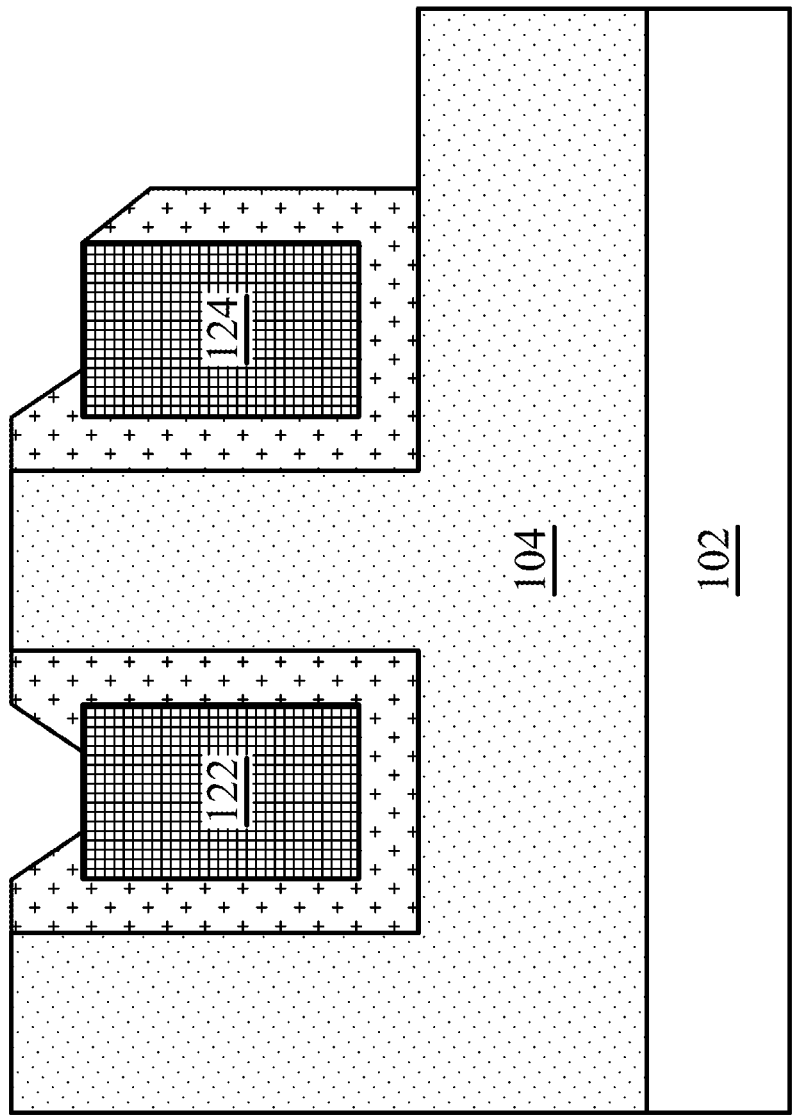

FIG. 14 illustrates a cross section view of the semiconductor device shown in FIG. 13 after an anisotropic etching process is applied to the top surface of the semiconductor device in accordance with various embodiments of the present disclosure. An anisotropic etching process is applied to the top surface of the semiconductor device in accordance with an embodiment. As a result, portions of the dielectric layer 1302 (not shown but illustrated in FIG. 12) have been removed. As shown in FIG. 13, once the anisotropic etching process is over, the top surfaces of the semiconductor region 104 and portions of the top surfaces of the gates 122, 124 are exposed.

Figure 15:
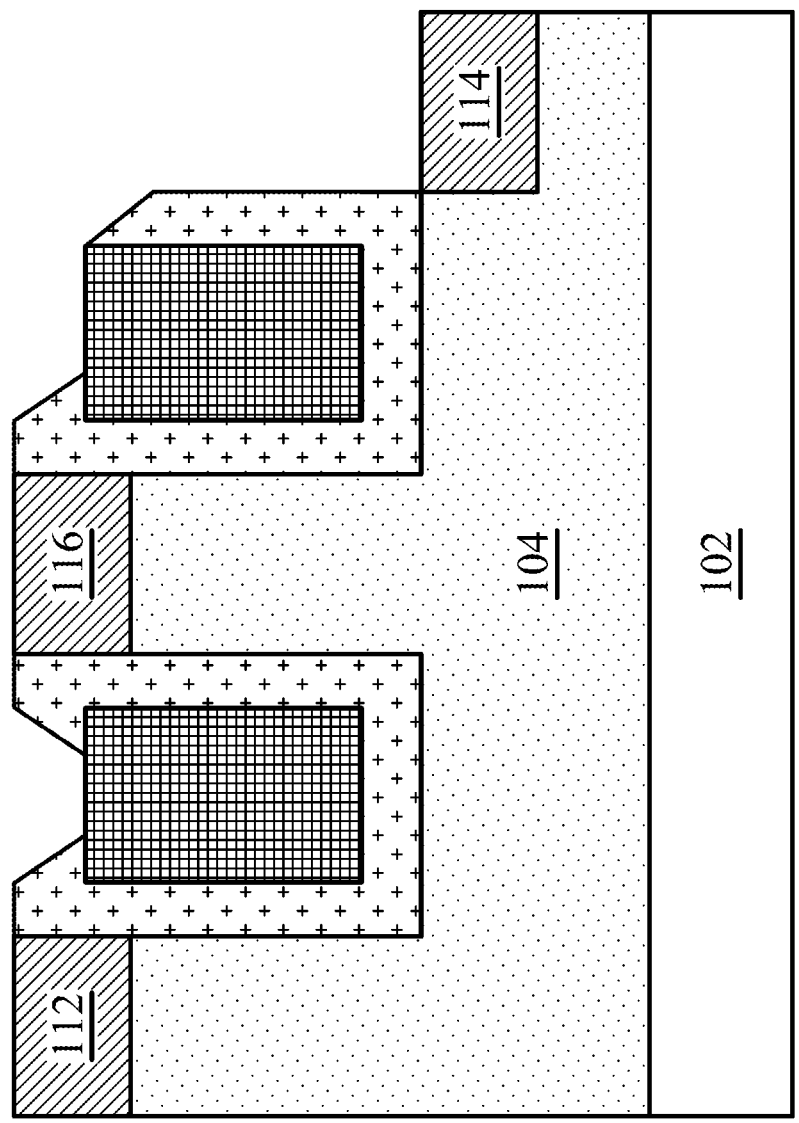

FIG. 15 illustrates a cross section view of the semiconductor device shown in FIG. 14 after drain/source regions are formed over the substrate in accordance with various embodiments of the present disclosure. In accordance with some embodiments, the drain/source regions (e.g., drain/source region 112) may be formed by implanting appropriate n-type dopants such as phosphorous, arsenic, or the like. In accordance with some embodiments, the doping density of the drain/source regions (e.g., drain/source region 112) is in a range from about $10^{18}/cm^3$ to about $1\times10^{21}/cm^3$. The ion implantation depth of the drain/source regions is in a range from about 5 nm to about 100 nm.

It should be noted that the fabrication step shown in FIG. 15 is an optional step. Without applying the ion implantation step to the semiconductor device, the drain/source regions of the junction-less MOS transistor 100 shown in FIG. 1 may be formed by adjusting the ion implantation concentration shown in FIG. 5.

Figure 16:
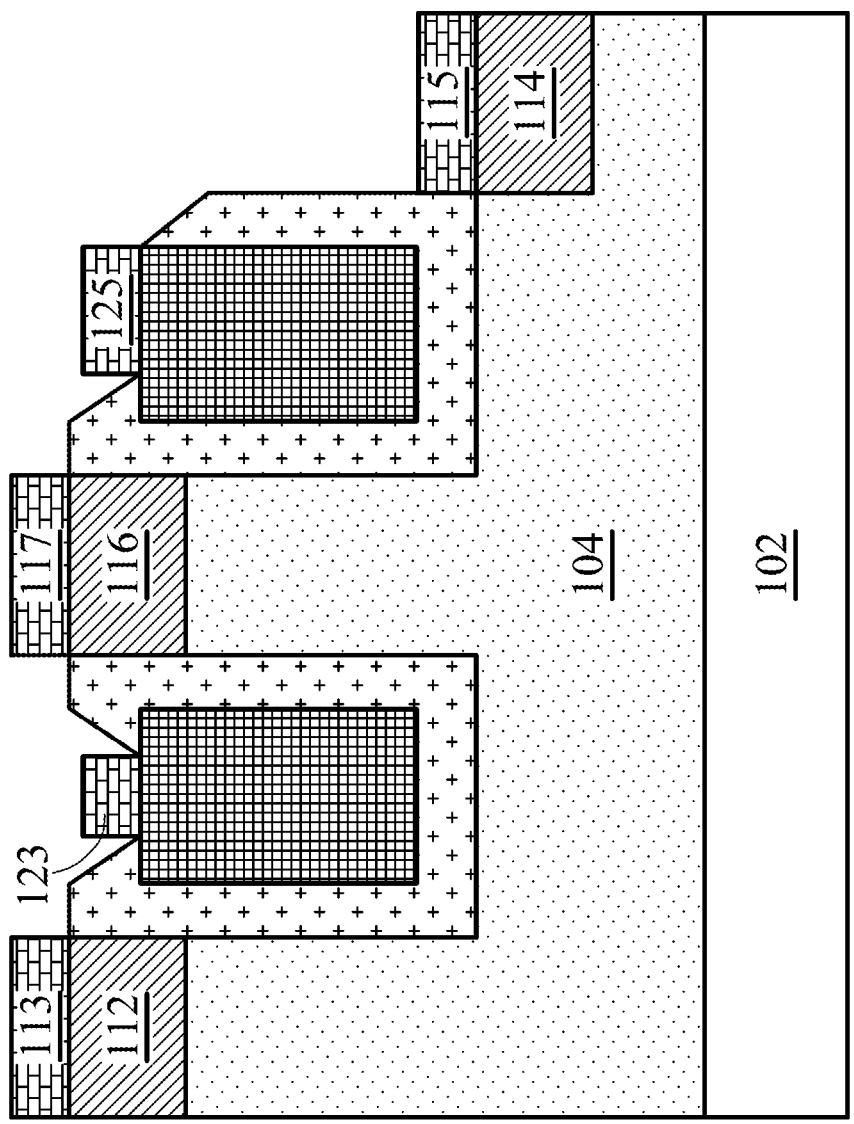

FIG. 16 illustrates a cross sectional view of the semiconductor device shown in FIG. 15 after silicide regions are formed over the drain/source regions and gate regions in accordance with various embodiments of the present disclosure. The silicide regions 113, 123, 117, 125 and 115 are formed by a salicide process. In a salicide process, a thin layer of metal is blanket deposited over a semiconductor wafer having exposed drain/source and gate electrode regions. The wafer is then subjected to one or more annealing steps. This annealing process causes the metal to selectively react with the exposed silicon of the source/drain regions and the gate electrodes, thereby forming metal silicide regions over the drain/source regions as well as the gate electrodes. The process is referred to as a self-aligned silicidation process because the silicide layer is formed only where the metal material directly contacts the silicon drain/source regions and the gate electrodes.

In some embodiments, silicide regions 113, 123, 117, 125 and 115 comprise metals that react with silicon such as titanium, platinum, cobalt and the like. However, other metals, such as manganese, palladium and the like, can also be used.

Figure 17:
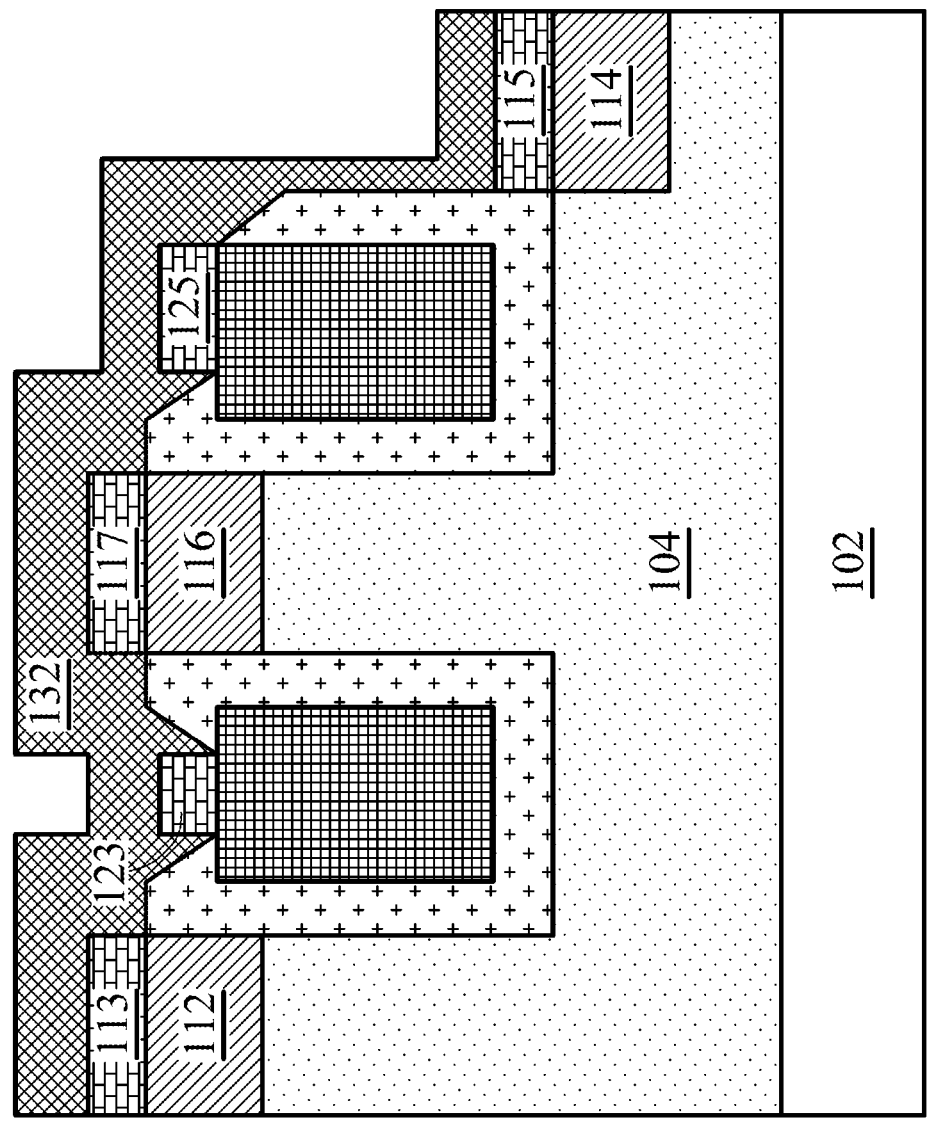

FIG. 17 illustrates a cross sectional view of the semiconductor device shown in FIG. 16 after a contact etch stop layer (CESL) is formed on the semiconductor device in accordance with various embodiments of the present disclosure. The CESL 132 may comprise commonly used dielectric materials, such as silicon nitride, silicon oxynitride, silicon oxycarbide, silicon carbide, combinations thereof, and multi-layers thereof. The CESL 132 is deposited over the semiconductor device through suitable deposition techniques such as sputtering, CVD and the like.

Figure 18:
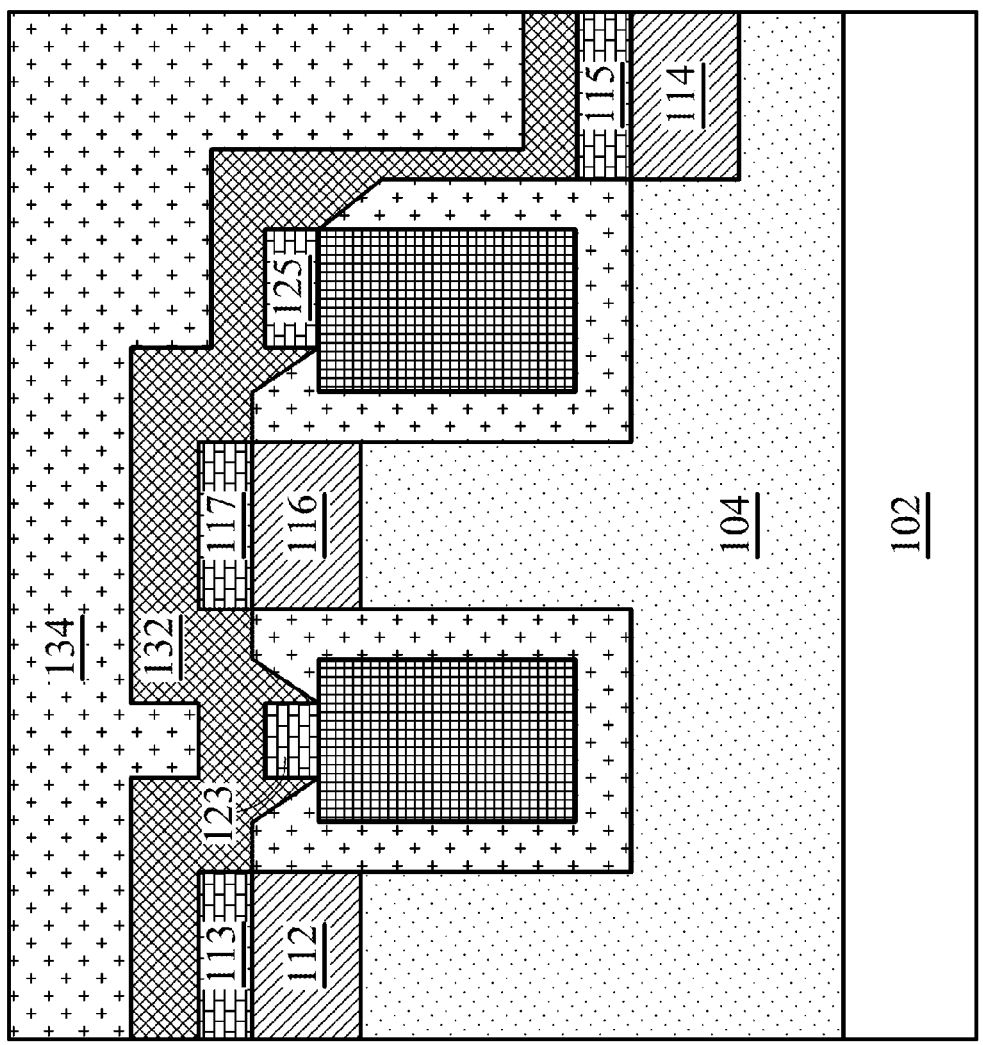

FIG. 18 illustrates a cross section view of the semiconductor device shown in FIG. 17 after a dielectric layer is deposited over the CESL layer in accordance with various embodiments of the present disclosure. The dielectric layer 134 is deposited over the CESL 132. The dielectric layer 134 may be a low-k dielectric layer having a low dielectric constant, for example, less than about 3.5. The dielectric layer 134 may also comprise a combination of materials, such as silicon nitride, silicon oxy-nitride, high-k dielectrics, low-k dielectrics, CVD poly-silicon or other dielectrics. The dielectric layer 134 may be deposited using suitable deposition techniques such as sputtering, CVD and the like.

Figure 19:
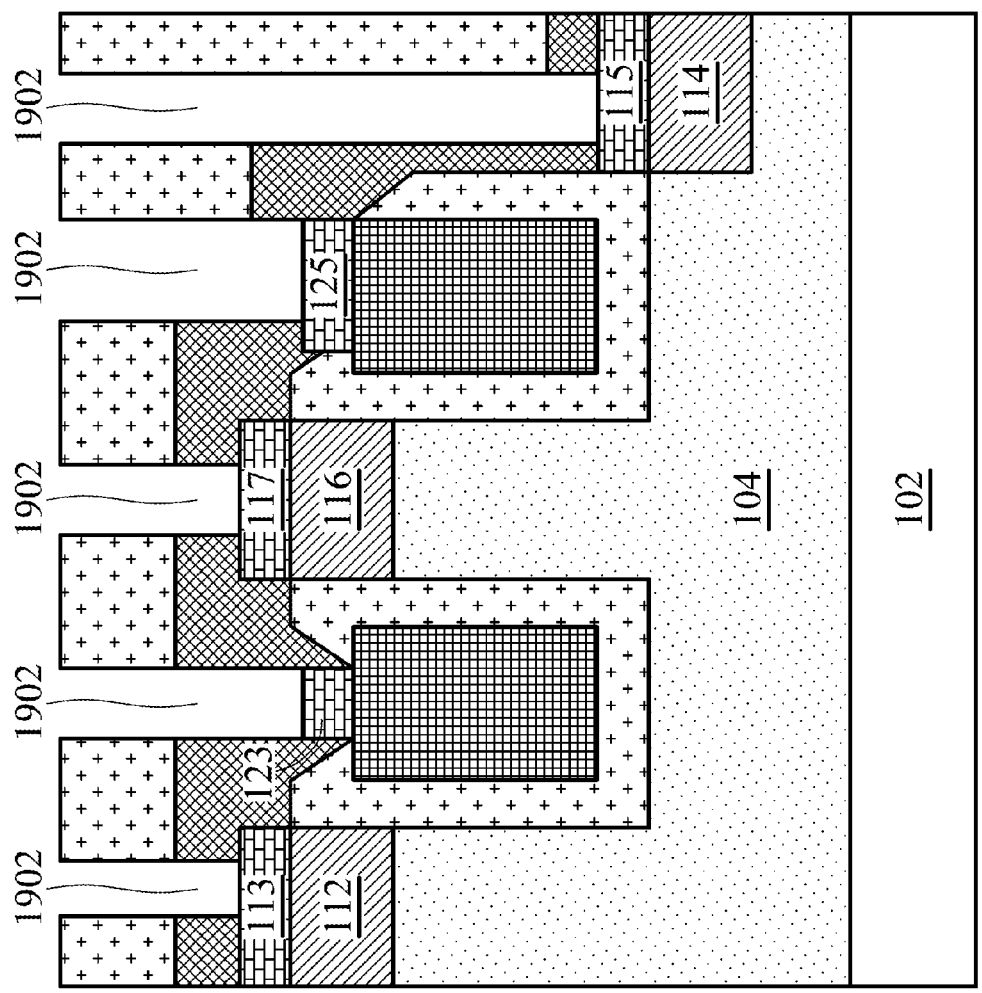

FIG. 19 illustrates a cross section view of the semiconductor device shown in FIG. 18 after an anisotropic etching process is applied to the dielectric layer and the CESL layer of the semiconductor device in accordance with various embodiments of the present disclosure. A plurality of openings 1902 are formed by etching the dielectric layer 134. With the help of the CESL layer 132, the etching of the dielectric layer 134 is more precisely controlled. The CESL layer 132 and dielectric layer 134 in the openings 1902 are also removed, exposing the underlying silicide regions over the gate electrodes and drain/source regions.

Figure 20:
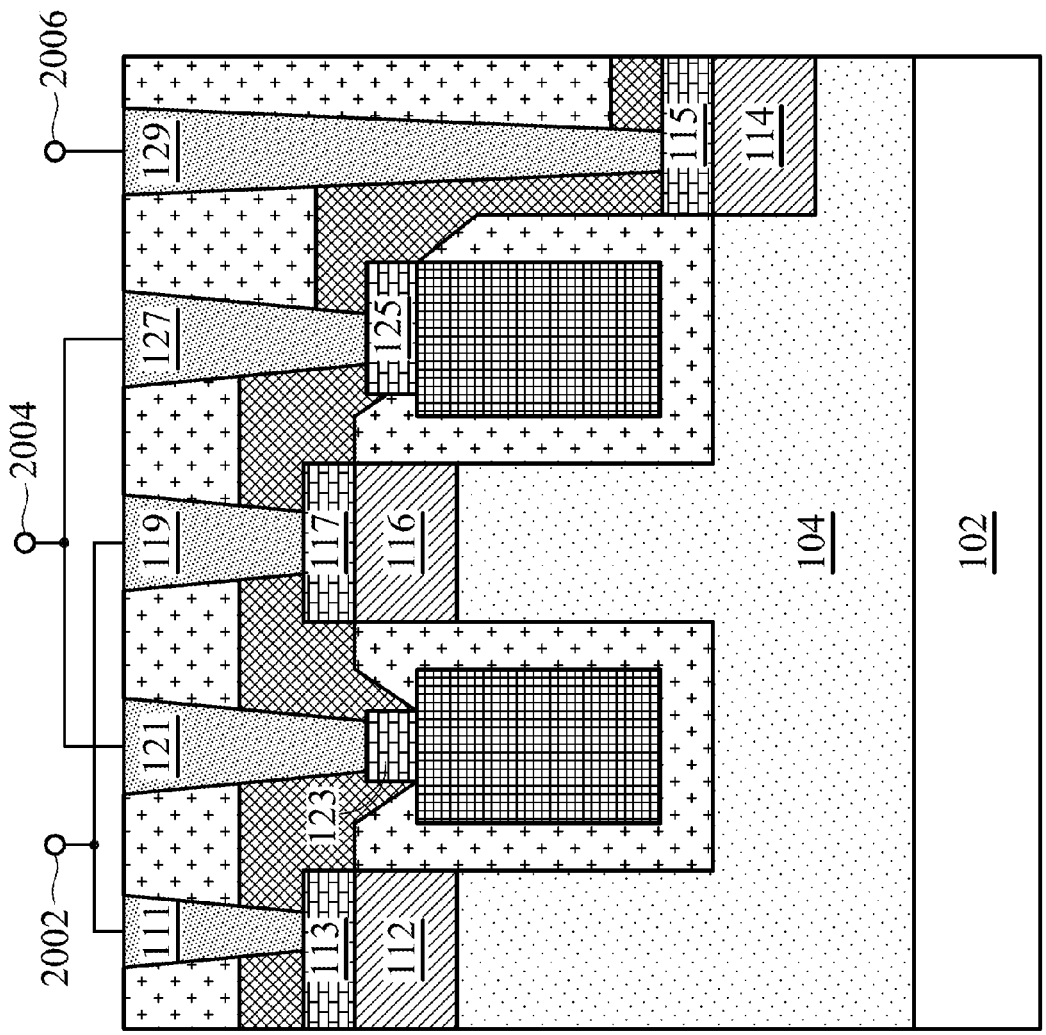

FIG. 20 illustrates a cross section view of the semiconductor device shown in FIG. 19 after metal materials are filled in the openings of the semiconductor device in accordance with various embodiments of the present disclosure. A metallic material, which includes tungsten, titanium, aluminum, copper, any combinations thereof and/or the like, is filled into the openings, forming contact plugs 111, 121, 119, 127 and 129.

FIG. 20 further illustrates a first drain/source terminal 2002, a first gate terminal 2004 and a second drain/source terminal 2006. In some embodiments, the first drain/source region 112 and the third drain/source region 116 may be coupled together to form the first drain/source terminal 2002. The first gate electrode and the second gate electrode are coupled together to form the gate terminal 2004. The second drain/source region 114 is coupled to a second drain/source terminal 2006.

It should be noted that the junction-less MOS transistor shown in FIG. 20 may be connected to other junction-less MOS transistors. More particularly, as shown in FIG. 2, a MOS device may include a plurality of junction-less MOS transistors connected in parallel. The first drain/source terminals of the plurality of junction-less MOS transistors are coupled together to form the first drain/source terminal of the MOS device.

Likewise, the second drain/source terminals of the plurality of junction-less MOS transistors are coupled together to form the second drain/source terminal of the MOS device. Furthermore, the gate terminals of the plurality of junction-less MOS transistors are coupled together to form the gate of the MOS device.

In accordance with an embodiment, an apparatus comprises a substrate of a first conductivity, wherein the substrate include a bulk semiconductor region, a first gate formed in a first trench in the bulk semiconductor region, a first drain/source region of the first conductivity, a second drain/source region of the first conductivity, wherein the first drain/source region and the second drain/source region are formed on opposing sides of the first gate in the bulk semiconductor region, a second gate formed in a second trench in the bulk semiconductor region, a third drain/source region of the first conductivity, wherein the third drain/source region and the second drain/source region are formed on opposing sides of the second gate in the bulk semiconductor region and a channel region formed in the bulk semiconductor region, wherein the channel region, the first drain/source region, the second drain/source region and the third drain source region share a same polarity.

In accordance with another embodiment, a device comprises a first junction-less transistor cell and a second junction-less transistor cell. The first junction-less transistor cell and the second junction-less transistor cell are connected in parallel, wherein the second junction-less transistor cell and the first junction-less transistor cell share a same structure.

The first junction-less transistor cell comprises a first gate electrode formed in a first trench of a substrate of a first conductivity, wherein the substrate include a bulk semiconductor region and a second gate electrode formed in a second trench in the bulk semiconductor region, wherein the first gate electrode and the second gate electrode are coupled together to form a first gate terminal.

The first junction-less transistor cell further comprises a first drain/source region of the first conductivity, a third drain/source region of the first conductivity, wherein the first drain/source region and the third drain/source region are formed on opposing sides of the first gate electrode in the bulk semiconductor region, and wherein the first drain/source region and the third drain/source region are coupled together to form a first drain/source terminal and a second drain/source region of the first conductivity, wherein the third drain/source region and the second drain/source region are formed on opposing sides of the second gate electrode in the bulk semiconductor region, and wherein the second drain/source region is coupled to a second drain/source terminal.

The first junction-less transistor cell further comprises a channel region formed in the bulk semiconductor region, wherein the channel region, the first drain/source region, the second drain/source region and the third drain source region share a same polarity.

In accordance with yet another embodiment, a method comprises providing a substrate, implanting ions with a first conductivity type into the substrate to form a bulk semiconductor region, forming a first trench and a second trench in the bulk semiconductor region.

The method further comprises forming a first gate in the first trench and a second gate in the second trench, forming a first drain/source region with the first conductivity type, forming a second drain/source region with the first conductivity type, wherein the first drain/source region and the second drain/source region are formed on opposing sides of the first gate, forming a third drain/source region with the first conductivity type, the third drain/source region and the second drain/source region are formed on opposing sides of the second gate and forming a channel region in the bulk semiconductor region, wherein the channel region, the first drain/source region, the second drain/source region and the third drain source region share a same polarity.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device comprising:
a substrate of a first conductivity, wherein the substrate include a bulk semiconductor region;
a first gate formed in a first trench in the bulk semiconductor region;
a first drain/source region of the first conductivity;
a second drain/source region of the first conductivity, wherein the first drain/source region and the second drain/source region are formed on opposing sides of the first gate in the bulk semiconductor region;
a second gate formed in a second trench in the bulk semiconductor region;
a third drain/source region of the first conductivity, wherein the third drain/source region and the second drain/source region are formed on opposing sides of the second gate in the bulk semiconductor region; and
a channel region formed in the bulk semiconductor region, wherein the channel region extends from the first drain/source region to the second drain/source region and the channel region, the first drain/source region, the second drain/source region and the third drain/source region share a same polarity, and wherein the channel region, the first drain/source region, the second drain/source region and the third drain/source region form a junction-less transistor.

2. The semiconductor device of claim 1, wherein:
the first drain/source region and the second drain/source region are coupled together to form a source of a metal oxide semiconductor transistor; and
the third drain/source region is a drain of the metal oxide semiconductor transistor.

3. The semiconductor device of claim 1, wherein:
the first drain/source region and the second drain/source region are coupled together to form a drain of a metal oxide semiconductor transistor; and
the third drain/source region is a source of the metal oxide semiconductor transistor.

4. The semiconductor device of claim 1, wherein:
the first gate and the second gate are coupled together to form a gate of a metal oxide semiconductor transistor.

5. The semiconductor device of claim 1, wherein:
the bulk semiconductor region is of a doping concentration in a range from about $1\times10^{15}/cm^3$ to about $1\times10^{19}/cm^3$.

6. The semiconductor device of claim 1, wherein:
a depth of the bulk semiconductor region is in a range from about 0.1 um to about 2 um.

7. The semiconductor device of claim 1, wherein:
the first trench is of a first width in a range from about 10 nm to about 50 nm; and
the second trench is of a second width in a range from about 10 nm to about 50 nm.

8. The semiconductor device of claim 1, wherein:
the first trench is of a first depth in a range from about 10 nm to about 300 nm; and
the second trench is of a second depth in a range from about 10 nm to about 300 nm.

9. A device comprising:
a first junction-less transistor cell comprising:
a first gate electrode formed in a first trench in a bulk semiconductor region of a first conductivity, wherein the bulk semiconductor region is in a substrate;
a second gate electrode formed in a second trench in the bulk semiconductor region, wherein the first gate electrode and the second gate electrode are coupled together to form a first gate terminal;
a first drain/source region of the first conductivity;
a third drain/source region of the first conductivity, wherein the first drain/source region and the third drain/source region are formed on opposing sides of the first gate electrode in the bulk semiconductor region, and wherein the first drain/source region and the third drain/source region are coupled together to form a first drain/source terminal;
a second drain/source region of the first conductivity, wherein the third drain/source region and the second drain/source region are formed on opposing sides of the second gate electrode in the bulk semiconductor region, and wherein the second drain/source region is coupled to a second drain/source terminal; and
a channel region formed in the bulk semiconductor region, wherein the channel region, the first drain/source region, the second drain/source region and the third drain/source region share a same polarity and an edge of the channel region is in direct contact with an edge of the first drain/source region; and
a second junction-less transistor cell connected in parallel with the first junction-less transistor cell, wherein the second junction-less transistor cell and the first junction-less transistor cell share a same substrate.

10. The device of claim 9, wherein:
the first conductivity is an n-type conductivity.

11. The device of claim 9, wherein:
the first conductivity is a p-type conductivity.

12. The device of claim 9, wherein:
the channel region is of a same doping concentration as the first drain/source region.

13. The device of claim 9, wherein:
gate terminals of the first junction-less transistor cell and second junction-less transistor cell are coupled together.

14. The device of claim 9, wherein:
first drain/source terminals of the first junction-less transistor cell and second junction-less transistor cell are coupled together; and
second drain/source terminals of the first junction-less transistor cell and second junction-less transistor cell are coupled together.

15. A device comprising:
a first gate in a first trench in a substrate;
a second gate in a second trench in the substrate, wherein:
a bottom of the first trench is level with a bottom of the second trench; and
the first gate is electrically connected to the second gate;
a first drain/source region and a second drain/source region, wherein:
the first drain/source region and the second drain/source region are formed on opposing sides of the first gate; and
the first drain/source region is electrically connected to the second drain/source region;
a third drain/source region, wherein the third drain/source region and the second drain/source region are formed on opposing sides of the second gate; and
a channel region formed in the substrate and in direct contact with the first drain/source region, wherein the channel region, the first drain/source region, the second drain/source region and the third drain/source region share a same polarity, and wherein dopants in a region from an edge of the first drain/source region to an edge of the second drain/source region have a same polarity as dopants in the first drain/source region.

16. The device of claim 15, wherein:
a bottom of the first drain/source region is level with a bottom of the second drain/source region.

17. The device of claim 15, wherein:
a bottom of the third drain/source region is lower than a bottom of the first drain/source region.

18. The device of claim 15, wherein:
the first drain/sourcing region, the second drain/sourcing region and third drain/sourcing region have a doping concentration in a range from about $10^{18}/cm^3$ to about $1 \times 10^{21}/cm^3$.

19. The device of claim 15, wherein:
the first trench and the second trench are of a width in a range from about 10 nm to about 50 nm and a depth in a range from about 10 nm to about 300 nm.

* * * * *